United States Patent
Knowles et al.

(10) Patent No.: US 9,331,259 B2
(45) Date of Patent: May 3, 2016

(54) INTRINSIC ADAPTIVE AND AUTONOMIC PIEZOTRANSFORMER CIRCUITS

(75) Inventors: Gareth J. Knowles, Williamsport, PA (US); William M. Bradley, Williamsport, PA (US); John Murray, Centereach, NY (US); Ross Bird, Williamsport, PA (US); Jon Zook, Williamsport, PA (US)

(73) Assignee: QorTek, Inc., Williamsport, PA (US)

( * ) Notice: Subject to any disclaimer, the term of this patent is extended or adjusted under 35 U.S.C. 154(b) by 269 days.

(21) Appl. No.: 14/347,465

(22) PCT Filed: Aug. 1, 2012

(86) PCT No.: PCT/US2012/049232
§ 371 (c)(1),
(2), (4) Date: Mar. 26, 2014

(87) PCT Pub. No.: WO2013/019905
PCT Pub. Date: Feb. 7, 2013

(65) Prior Publication Data
US 2014/0247633 A1    Sep. 4, 2014

Related U.S. Application Data

(60) Provisional application No. 61/513,810, filed on Aug. 1, 2011.

(51) Int. Cl.
*H02M 7/53* (2006.01)
*H01L 41/04* (2006.01)
(Continued)

(52) U.S. Cl.
CPC ............ *H01L 41/044* (2013.01); *H02M 3/335* (2013.01); *H02M 7/53* (2013.01); *H01L 41/107* (2013.01); *H02M 2007/4815* (2013.01); *H02M 2007/4818* (2013.01)

(58) Field of Classification Search
CPC ............. H02M 2007/4815; H02M 2007/4818; H02M 7/537; H02M 7/5387; H02M 7/53871; H02L 41/107; H02L 310/359; H02L 41/044
See application file for complete search history.

(56) References Cited

U.S. PATENT DOCUMENTS

| 3,689,781 A | 9/1972 | Kawada |
| 3,764,848 A | 10/1973 | Berlincourt et al. |

(Continued)

FOREIGN PATENT DOCUMENTS

| EP | 1146630 A2 | 10/2001 |
| EP | 2003709 A1 | 12/2008 |

OTHER PUBLICATIONS

International Application No. PCT/US2012/049232, International Preliminary Report on Patentability, dated Feb. 4, 2014.
(Continued)

*Primary Examiner* — Timothy J Dole
*Assistant Examiner* — Ishrat Jamali
(74) *Attorney, Agent, or Firm* — Cahn & Samuels, LLP

(57) ABSTRACT

An intrinsic piezoelectric transformer circuit a piezoelectric transformer circuit is provided that has a primary side component including first and second electrodes, a secondary side component including first and second electrodes, and at least one tertiary component including first and second electrodes. A power bridge is provided which includes one or more switches, each switch has a gate terminal that is directly connected to the second electrode of the tertiary component of the piezoelectric transformer. The first electrode of the tertiary component of the piezoelectric transformer is connected to a reference for the one or more switches of the power bridge. The first electrode of the primary component of the piezoelectric transformer is electrically connected to a power bridge output and the second electrode of the primary component of the piezoelectric transformer is connected to a ground terminal.

9 Claims, 15 Drawing Sheets

(51) Int. Cl.
    *H02M 3/335*     (2006.01)
    *H02M 7/48*     (2007.01)
    *H01L 41/107*     (2006.01)

(56) References Cited

U.S. PATENT DOCUMENTS

| | | | |
|---|---|---|---|
| 4,654,771 A * | 3/1987 | Stasch | H02M 3/33553 363/19 |
| 5,341,061 A | 8/1994 | Zaitsu | |
| 5,760,619 A | 6/1998 | Furuhashi et al. | |
| 5,872,419 A | 2/1999 | Hall et al. | |
| 5,923,542 A | 7/1999 | Sasaki et al. | |
| 5,969,954 A * | 10/1999 | Zaitsu | H02M 3/337 310/319 |
| 6,016,052 A * | 1/2000 | Vaughn | H01L 41/044 310/318 |
| 6,052,300 A | 4/2000 | Bishop et al. | |
| 6,147,439 A | 11/2000 | Takagi et al. | |
| 6,151,232 A | 11/2000 | Furuhashi et al. | |
| 6,331,748 B1 | 12/2001 | Hong | |
| 6,362,559 B1 | 3/2002 | Boyd | |
| 6,738,267 B1 | 5/2004 | Sabater | |
| 7,202,649 B2 | 4/2007 | Bird et al. | |
| 2005/0156774 A1 * | 7/2005 | Li | H02M 3/337 341/155 |
| 2010/0328969 A1 * | 12/2010 | Meyer | H01L 41/044 363/21.03 |
| 2011/0051461 A1 | 3/2011 | Buchwald | |
| 2013/0134881 A1 * | 5/2013 | Von Malm | F21K 9/135 315/113 |
| 2013/0169198 A1 * | 7/2013 | Wei | H02P 31/00 318/116 |

OTHER PUBLICATIONS

European Application No. EP12820778, Supplementary European Search Report, dated Jun. 1, 2015.
Bronstein, S.:"Piezoelectric Transformers in Power Electronics", Oct. 2005, pp. 1-1 to 6-17, Ben-Gurion University of the Negev Department of Electrical and Computer Engineering.
"Multi-Topology Piezoelectric Transformer Controller", Texas Instruments Incorporated, Nov. 2001, 1-27, Dallas TX.

* cited by examiner ic
INTRINSIC ADAPTIVE AND AUTONOMIC PIEZOTRANSFORMER CIRCUITS This application claims the benefit of U.S. provisional Application Ser. No. 61/531,810, filed Aug. 1, 2011, which is hereby incorporated by reference.

I. FIELD OF THE INVENTION

The invention relates to piezoelectric transformer circuits that enable high performance efficiency over large variations in operational parameters through intrinsic or autonomic control.

II. BACKGROUND TO THE INVENTION

The initial concept of a piezoelectric transformer (PT) was proposed by C. A. Rosen, K. Fish, and H. C. Rothenberg and is described in the U.S. Pat. No. 2,830,274, applied for in 1954. Most of the focus since that time has been on work on high voltage applications such as described in U.S. Pat. No. 2,969,512 with variations of the basic Rosen design. Several different piezoelectric transformer designs have appeared over the years to address power limitations and step-down limitations including thickness mode piezoelectric transformers described in U.S. Pat. No. 5,118,982 U.S. and U.S. Pat. No. 5,241,236.

When working with resonant devices, including piezoelectric transformers, it is often desirable to incorporate resonant frequency self-adjustment capability. It is well known that piezoelectric transformers devices are most efficient in power transference into a given load between their resonance and anti-resonance frequencies closely associated with a selected mechanical vibration mode. There are several important reasons why a piezoelectric transformer device might benefit from the ability to self-adjust its operating drive frequency of mechanical excitation of the primary side. These may include variations in load, operating environment conditions, maximizing gain, voltage gain adjustment, and manufacture tolerances. Often associated with such a loss of efficiency is increase in the circulating current as the selected drive frequency and mechanical resonance drift apart as to cause the drive waveform to have a frequency lower than that of the mechanical resonance of the piezoelectric transformers device. The correct design of such primary side control circuitry as to enable self-adjustment of its operating drive frequency is often the main issue in development and realization of any particular switch-controlled piezoelectric or electromagnetic transformer.

It is well known in the literature that, due to their high Qm characteristics, while having very high efficiency, piezoelectric transformers devices exhibit a narrow band that require operation close to a resonance frequency. Best performance is achieved with the frequency of operation in the inductive region slightly above resonance between the resonance frequency and the anti-resonance frequency because the Qm value of piezoelectric transformers devices is very high, but resonant region is very narrow; therefore can be viewed as a voltage controlled current source, the transformer ratio and efficiency are strongly dependent on frequency control, load fluctuation and input voltage variations. Thus the target operating frequency for maximum efficiency or maximum power delivery has a strong dependence on load temperature, ceramic temperature, and supply characteristics. Inability to adjust the operating frequency in response to changes in any of these parameters will reduces the input-output power transfer efficiency of the PT, in some cases dramatically.

The conventional approach to piezoelectric transformer design has been to develop an optimal linear or switching drive circuit that develops an alternating waveform at a frequency intended to maximize a metric such as maximum throughput power or input to output efficiency.

A number of control augmentations have been designed to enable self-adjustment of the operating drive waveform frequency. Prior art imparts four sequentially connected elements to enable self-adjustment of the operating drive waveform frequency: some form of measurement to generate feedback signals, some form of feedback isolation, some form of feedback control and some form of ac generating drive circuit (modulation). These four sequential elements are so designed and configured as to cause a fifth sequential element consisting of a set of power semiconductors or linear amplifier to generate the alternating drive signal to mechanically excite the primary (driven) side of a PT.

Early piezoelectric transformer devices used a combination of a Voltage Controlled Oscillator and analog circuitry. With the advent of silicon processor devices, modern piezoelectric transformer devices in employment now incorporate one or more digital processors to implement the measurement processing, the control strategy and the switching drive control signal generation.

Later, the prior art began employing voltage measurements taken at the secondary side of a piezoelectric transformer as to adjust the resonant drive frequency downward as a function of increasing load as disclosed in U.S. Pat. No. 5,768,111 (the '111 Patent). A voltage measurement system was introduced at the output secondary side of the piezoelectric transformer that provides a signal into an intermediate feedback control circuit. The feedback control circuit incorporates a voltage-controlled oscillator as to generate a control signal as an output that acts as input into a waveform generator that incorporates an adaptive pulse sequence generator. The feedback control circuit provides a commanded variation of the waveform generator as to cause it, in turn, to adjust the gate drive signal at a switchmode block that incorporates a pair of MOSFET switches. The modified output of the switchmode block provides a sinusoidal drive signal that connects to the primary side of the piezoelectric transformer that now better matches the change in mechanical resonance of the piezoelectric transformer due to variation of the output side electrical load. This construction is sometimes referred to as a self-adjusting circuit.

Subsequent approaches to piezoelectric transformer design have sought improvements in the self-adjusting circuit. Modifications of self-adjusting circuits have included replacing the separate oscillator within the feedback control circuit with an internal (self-mechanical) oscillator; replacing the separate oscillator with control modulation schemes such as PWM and PWM/PFM as to more broadly track variations in load or temperature; deriving the signal into the measurement component of the circuit of as output electrical measurements from the primary, deriving the signal into the measurement component of the circuit as output electrical signal measured at the secondary (driven) side of the piezoelectric transformer device or some combination of the electrical load (see FIG. 2); deriving the signal into the measurement component of the self-adjusting circuit as output electrical measurements directly from the secondary (output) side of the piezoelectric transformer and the electrical load (FIG. 3); deriving the signal into the measurement component of the self-adjusting circuit as the as output electrical measurements taken directly from the primary (driven) side of the piezoelectric transformer and the electrical load (see FIG. 4); included replacing the separate oscillator within the feedback control circuit with an internal (self-mechanical) oscillator with feedback controlled oscillator network incorporating a phase differential subcircuit.

Each of the approaches illustrated in FIGS. 1-4 are more specifically described herein. Referring to FIG. 1, a set of electrodes 11 is disposed as part of the secondary output (driven) component of the piezoelectric transformer device 100 which convey electrical signal information to the measurement and processing block 13 via an isolation block 12. The isolation block 12 maintains galvanic isolation of the measurement block 13, feedback control/filter block 14, and waveform generator block 15 from the output. Without this isolation block 12 the circuit implementation will nullify isolated operation of the transformer. The measurement block 13 processes the electrical signals from electrodes 11 and provides them as an input into a feedback control/filter block 14 at the same waveform frequency as that which appears on secondary component 2. The feedback control/filter block 14 subsequently performs calculus on these signals as to provide control inputs into a waveform generation block 15 as to adjust or modify the waveform frequency observed at tap 11. This often consists of the feedback circuit 14 performing calculus on a set of phase differential measurements. The waveform generator block 15 acts as to develop a command signal into the power circuit 16 as to generate an output from power circuit 16 that is a repetitive waveform of the adjusted frequency. This waveform is commonly a pulse train at the new adjusted frequency. The dc voltage level Vcc 21, of fixed amplitude, acts as an input into power circuit 16. Power circuit 16 consists of some components, usually power semiconductor switches or a linear amplifier as to act upon this dc voltage input as to produce an output at 17 that is a repetitive ac waveform of the adjusted waveform frequency commanded by waveform generator 15. The output 17 acts as an electrical input to a passive circuit 18 disposed between the power circuit 16 and the primary (input) side 1 of the piezoelectric transformer device 100. Commonly this passive circuit provides a conversion from pulse generation to sinusoid of the same frequency and amplitude. Such passive circuit block has also commonly been used to enable a desirable circuit topology such as Zero Voltage Switching (ZVS) operation. The outputs of the passive circuit 18 provide a voltage waveform at the adjusted frequency. The voltage waveform is electrically connected to sets of electrodes 7a and 7b disposed integral to the primary (input) side 1 of the piezoelectric transformer device 100 as to induce fluctuations in electrical field at the same adjusted waveform frequency as commanded by the waveform generator 15. The electrodes are so configured as to utilize the converse effect of piezoelectric material. The converse effect causes an internal stress cycle at the adjusted waveform frequency as commanded by the waveform generator 15. The stress cycle mechanically couples with a secondary (load output) component 2 of device 100 via an electrical isolation region 6. Region 2 incorporates sets of electrodes that use the converse effect of the induced stress cycle as to generate a sinusoidal voltage at locations 11. The potential difference between the locations 11 and ground represent a voltage that is a very small phase shift of the operating mechanical frequency of the device 100. Location 11 circuit elements may be an independent and galvanically isolated from load output 20 connections 9 and 10 incorporated in device 100, or these may be directly connected to one or more of the load output connections.

Referring to FIG. 2, the operation is very similar to that described for FIG. 1 with the primary distinction being that measurement block 12 is the additional recipient of a set of parametric electrical measurements, such as load, current, phase 19b taken at some circuit locations 19c in the load circuit. Parts of measurement block, control block and drive block are commonly subsumed by a custom controller microchip 101.

FIG. 3 illustrates a variation of the extrinsic circuit strategy of the prior art to enable self-adjusting frequency waveform drive signal on the primary (input) side of the piezoelectric transformer that uses electrical parameter measurements taken at both primary and secondary sides of the piezoelectric transformer device. The drive side 1 now consists of two separate components 1a and 1b that may, or may not, be electrically isolated. Due to the direct piezoelectric effect, component 1a generates a charge waveform of the same frequency as that of waveform generator 15. Locations 19a and 19b are in this case recipients of a set of electrical signals from the second component of the primary 1a and the secondary (output) component 2. Parts of measurement block, control block and drive block are commonly subsumed by a custom controller microchip 101.

The prior art has exemplified circuits that are a combination of measured parametric outputs of FIG. 2 and FIG. 3 along with introducing additional subcircuits such as phase differential control subcircuitry or secondary voltage regulation switch subcircuits as to enhance some intended performance metric such as throughput power, output regulation or maximum efficiency. All such prior art builds upon, and subsumes, the sequential circuit layout of FIG. 1.

Referring to FIG. 4, the circuit introduces an electrically isolated tertiary component 3 of piezoelectric transformer device 100 that is isolated both from the primary 1 and secondary (output) 2. A set of electrodes are disposed as integral to the tertiary 3a as to generate a charge when mechanically excited. This charge generation by the electrodes provides an output set of electrical parameters that act as input signals to a feedback circuit 14. The common frequencies of the output electrical parameters of these signals at 5a are sinusoidal and approximate to the value of the operational mechanical mode of the piezoelectric transformer. The feedback circuit 14 directly performs calculus on these incoming signals and provides resultant (analog or digital) output signal transferred as input at the waveform generator 15 as to appropriately adjust the drive frequency at the set of electrodes inclusive in component 1. The voltage waveform is electrically connected to sets of electrodes 7a and 7b disposed integral to the primary (input) side 1 of the piezoelectric transformer device 100 as to induce a fluctuations in electrical field at the same adjusted waveform frequency as commanded by the waveform generator 15. The electrodes are so configured as to utilize the converse effect of piezoelectric material. The converse effect causes an internal stress cycle at the adjusted waveform frequency as commanded by the waveform generator 15.

The stress cycle mechanically couples with a tertiary output subcomponent 3 of device piezoelectric transformer 100 via electrical isolation regions 6a and 6b. Regions 6a and 6b are constructed as to cause region 3 to be electrically isolated from the primary (input) component 1 and the secondary (output) component 2 of the piezoelectric transformer 100. Region 3 incorporates sets of electrodes that use the converse effect of the induced stress cycle as to generate voltages at locations 5a and 5b. The potential difference between the 5a and 5b represents a sinusoidal voltage waveform, or sinusoidal current that is not referenced to the ground reference of either the primary component 1 or the secondary component 2. This is advantageous in that this potential is insensitive to variations in the load potential difference between 9 and 10. The sinusoidal voltage represents a small phase shift of the actual operating mechanical frequency of the device 100. The feedback circuit acts to provide a calculated input signal into a resonant drive circuit comprised of waveform generator 15 and drive circuit 16 consisting of power semiconductor switches. The output of a resonant driver circuit consists of a pulse train at the commanded frequency as developed by the Feedback feedback circuit. piezoelectric transformer devices do not withstand hard switching drive waveforms, thus, in order to protect from damage to the piezoelectric transformer device it will be necessary to adjust the hard switched pulse train output of the driver circuit by disposing a passive circuit 18 between the driver circuit and the input voltage waveforms at the sets of electrodes 7a and 7b.

All such modifications as depicted in FIGS. 1-4, along with the designs incorporated into all their references, that seek to improve the self-adjusting drive waveform piezoelectric transformer devices of the '111 Patent provide for the same sequential circuit topology connectivity as the '111 Patent. That being the sequential or series connection of a feedback measurement block, isolation block, feedback control block and waveform generator (modulation) block as to drive a set of power semiconductors or linear amplifier. Such 'extrinsic' piezoelectric transformer circuits provide for a self-adjusting voltage waveform excitation of the primary side of a PT device, as shown in FIG. 1, that adjusts as to reflect the updated value of the mechanical excitation design point of interest. Because of the employment of such multiple function blocks within the piezoelectric transformer circuit needed to achieve correct adjustment of the resonant frequency drive signal, devices of prior art entail difficulties with cost, complexity, part count, and digital component usage Some prior art approaches have sought to employ a replacement configuration for the standard controlled power switch sinusoidal voltage waveform primary side excitation. This approach instead seeks to use a feedback-controlled oscillator network to generate a self-adjustable frequency variable drive. This approach nevertheless still incorporates all four elements of measurement block, measurement isolation block, measurement control block and drive circuit block. Thus, in such an approach, the measurement, measurement control, and drive circuit block must also maintain this galvanic isolation from the output or the feedback implementation will nullify isolated operation of the transformer.

There have been efforts to improve the basic circuit design of the '111 Patent and its modifications by introducing (galvanic) isolated tertiary components into the piezoelectric transformer construction as to provide the direct signal generation that does not emanate from the primary (drive) side of the piezoelectric transformer, secondary (output) side of the piezoelectric transformer or the electrical load. The advantage of the design is it bypasses any need for a measurement block and, in some cases, the need for an isolation block. The introduction of an isolated measurement enables improvements in the overall performance and efficiency. This prior art a controlling drive circuit to adjust frequency in response to variations in load or temperature takes as input the outputs of one or more isolated tertiary components of the piezoelectric transformer and then uses these as direct signal inputs into the feedback control circuit of the extrinsic circuit. The direct signal input extrinsic circuit modification is shown in FIG. 4.

Complex circuitry is required in order to enable tracking and adjustment of the resonant frequency, or equivalent metric. The known extrinsic circuits require a measurement block, isolation block, feedback control block and waveform generation (PWM/PFM modulator or oscillation controller), or some combination thereof, to take an output signal and drive a power switch or linear amplifier block as to enable self-adjusting waveform excitation at the primary side of a piezoelectric transformer device. This type of extrinsic circuit solution to the design of variable frequency drive piezoelectric transformers can be sensitive, complicated and costly. This leads to simpler designs that only operate at fixed frequency with the goal to modify the drive waveform generator circuit as to maximize the operational region over which it is effective. However, fixed frequency drive PTs now also require a secondary reference resonance source on the primary side of the transformer. A significant dilemma is that fixed frequency drive piezoelectric transformer devices of prior art cannot tolerate significant changes in load, thermal or supply conditions whereas variable frequency drive introduce complexity, cost and failure modes.

III. SUMMARY OF THE INVENTION

In accordance with an aspect of the invention, a piezoelectric transformer circuit is provided that includes a piezoelectric transformer having a primary side component including first and second electrodes, a secondary side component including first and second electrodes, and at least one tertiary component including first and second electrodes. A power bridge is provided which includes one or more switches, each switch has a gate terminal that is directly connected to the second electrode of the tertiary component of the piezoelectric transformer. The first electrode of the tertiary component of the piezoelectric transformer is connected to a reference for the one or more switches of the power bridge. The first electrode of the primary component of the piezoelectric transformer is electrically connected to a power bridge output and the second electrode of the primary component of the piezoelectric transformer is connected to a ground terminal.

In at least one embodiment, the piezoelectric transformer circuit of the present invention enables high power transfer efficiency over a wide variation in operating conditions through feedback of the auxiliary outputs of the piezoelectric transformer directly to the drive of a power bridge.

In at least one embodiment, the piezoelectric transformer circuit of the present invention includes an internal adaptive reactive circuit that helps maintain power transfer efficiency performance over large operational variations.

In at least one embodiment, the piezoelectric transformer circuit of the present invention enables adaptive self-adjustment of an input side drive waveform in response to variations in operational condition without employing dedicated measurement or feedback circuitry.

An objective of the present invention is to provide a new piezoelectric transformer circuit that provides highly efficient power flow conversion and maintains over wide variations in operational conditions, such as load variations, supply voltage variations and temperature variations.

Another objective of the present invention is to provide a new piezoelectric transformer circuit that provides highly efficient-power flow conversion, that uses a minimal number of circuit components.

Still another objective of the present invention is to provide a new piezoelectric transformer circuit that is highly efficient without requiring incorporation of digital components.

A further objective of the present invention is to provide a new piezoelectric circuit that is highly efficient while using a minimal number of magnetic components.

Yet another objective of the present invention is to provide a new piezoelectric transformer circuit that is highly efficient without incorporating dedicated measurement, isolation or feedback circuitry.

An advantage of at least one embodiment of the invention is that it provides a piezoelectric transformer circuit that is substantially free from digital components and magnetic components thus facilitating high efficiency power flow dc/ac level shifting.

An advantage of at least one embodiment of the invention is it provides a piezoelectric transformer circuit that maintains high efficiency power flow dc/ac level shifting in the presence of variations in loads and voltages.

An advantage of at least one embodiment of the invention is that it provides a piezoelectric transformer circuit that has a higher safe operating region of the power semiconductors as to enable larger circulating currents at the drive semiconductor components than that of prior art.

An advantage of at least one embodiment of the invention is that it eliminates the need for dedicated measurement, waveform generation, isolation block and/or feedback circuitry.

An advantage of at least one embodiment of the invention is that it provides a piezoelectric transformer circuit that automatically adjusts its frequency for opiezoelectric transformerimal performance in response to changes in operating environment, including temperature and load.

An advantage of at least one embodiment of the invention is that employs direct connection from the gates of its power semiconductors to the output of a galvanic isolated tertiary tap that enables the piezoelectric transformer circuit to include only minimal passive components on the primary side of the piezoelectric transformer.

An advantage of at least one embodiment of the invention is that, due to the minimal number of components needed for implementation, the piezoelectric transformer circuit can be packaged into a standard microelectronics package.

One or more of the foregoing objectives or advantages is realized by at least one embodiment of the piezoelectric transformer circuit of the present invention.

IV. BRIEF DESCRIPTION OF THE DRAWINGS

FIG. 1 shows an extrinsic self-adjustable drive frequency waveform circuit using feedback control of measurements taken at the secondary (driven) side of a piezoelectric transformer.

FIG. 2 demonstrates an extrinsic self-adjustable drive frequency waveform circuit using feedback control of measurements taken at the secondary (driven) side and the electrical load of a piezoelectric transformer.

Figure 11A:
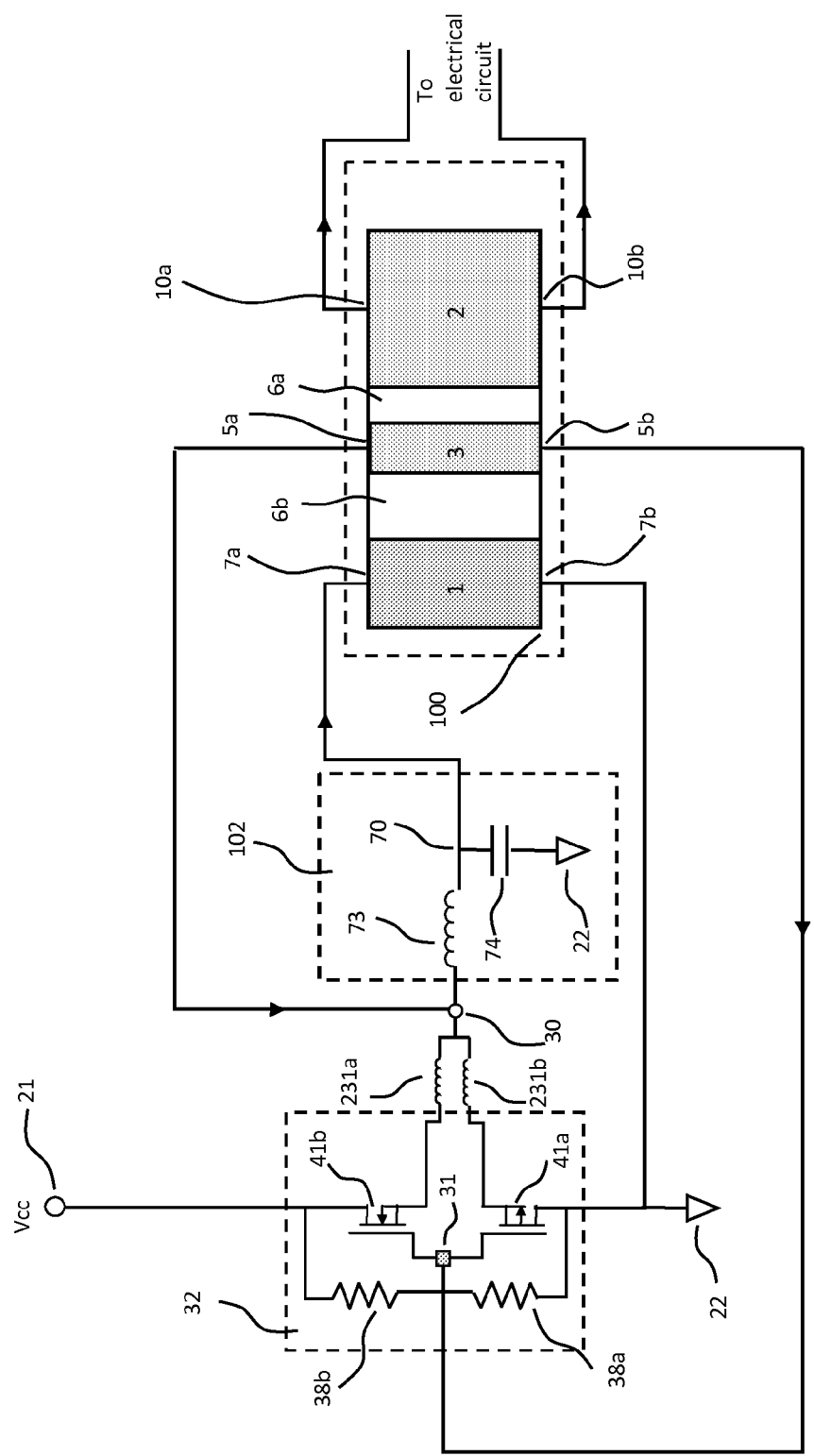

FIG. 11*a* shows an embodiment of exemplary subclass of half-bridge autonomic intrinsic piezoelectric transformer DC/AC voltage level shifter circuit in accordance with the present invention.

Figure 11B:
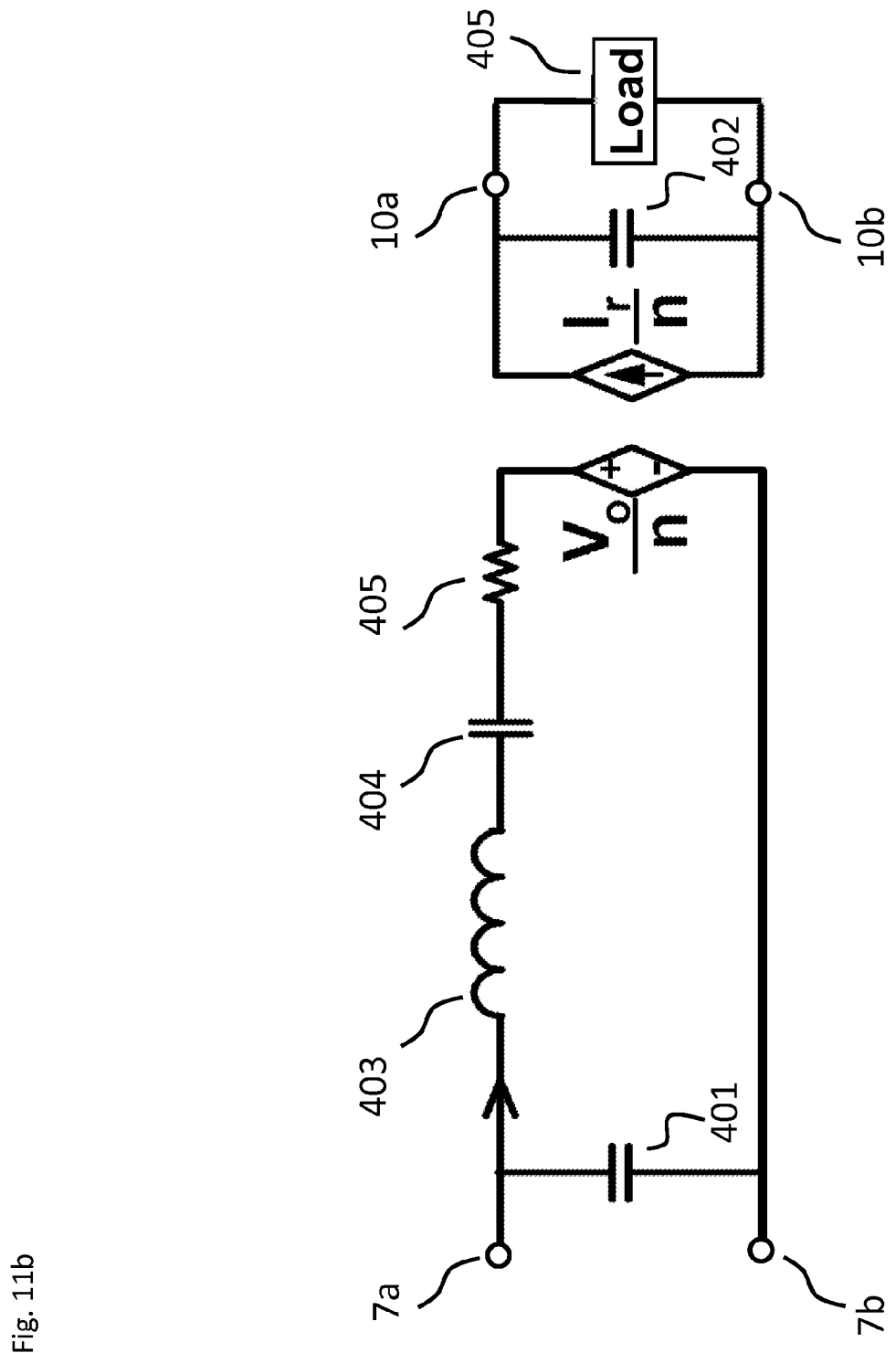

FIG. 11*b* illustrates an equivalent electric circuit for a piezoelectric transformer.

Figure 12:
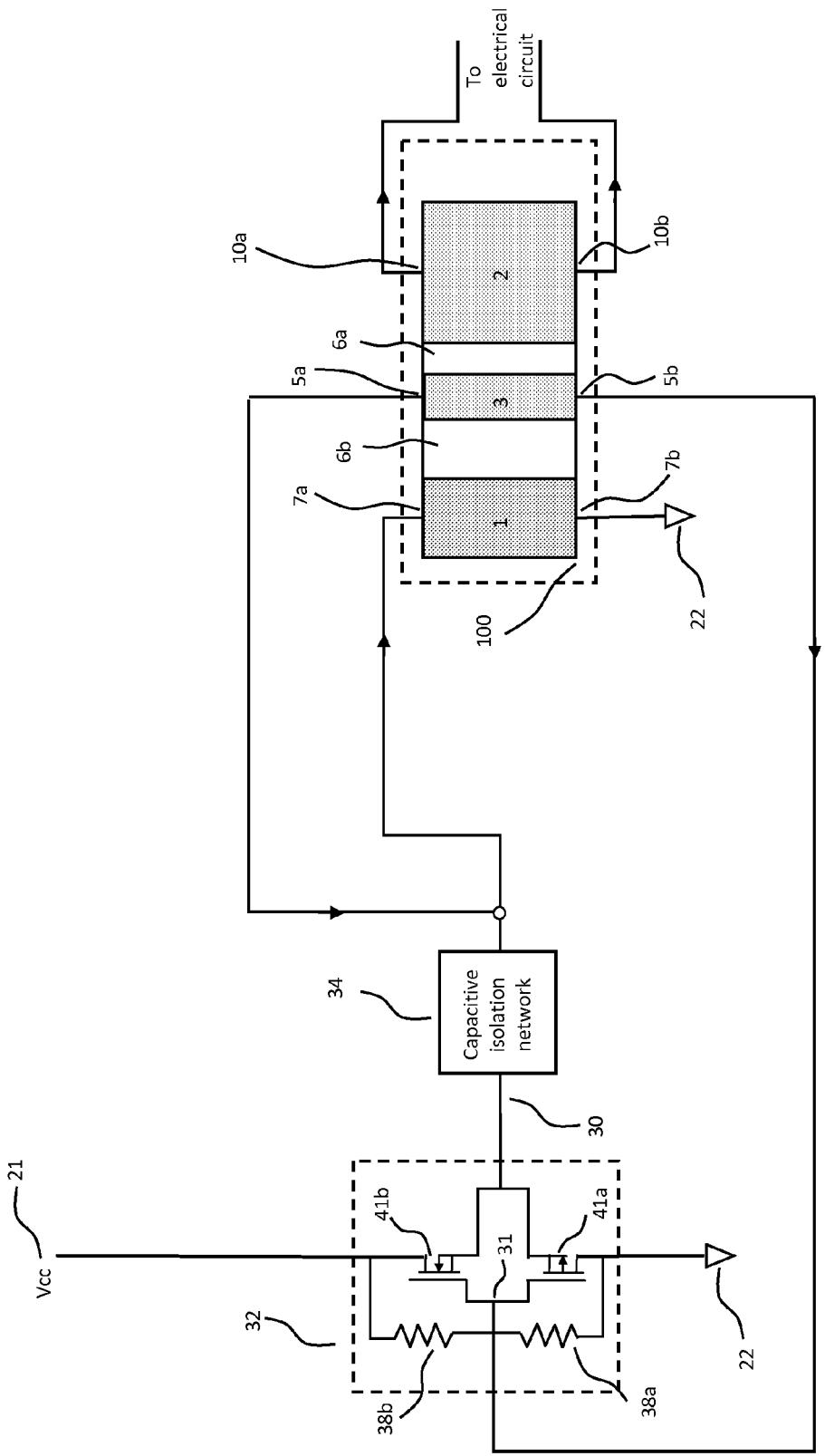

FIG. 12 depicts an embodiment of exemplary subclass of half-bridge autonomic intrinsic piezoelectric transformer DC/AC voltage level shifter circuit in accordance with the present invention.

Figure 13:
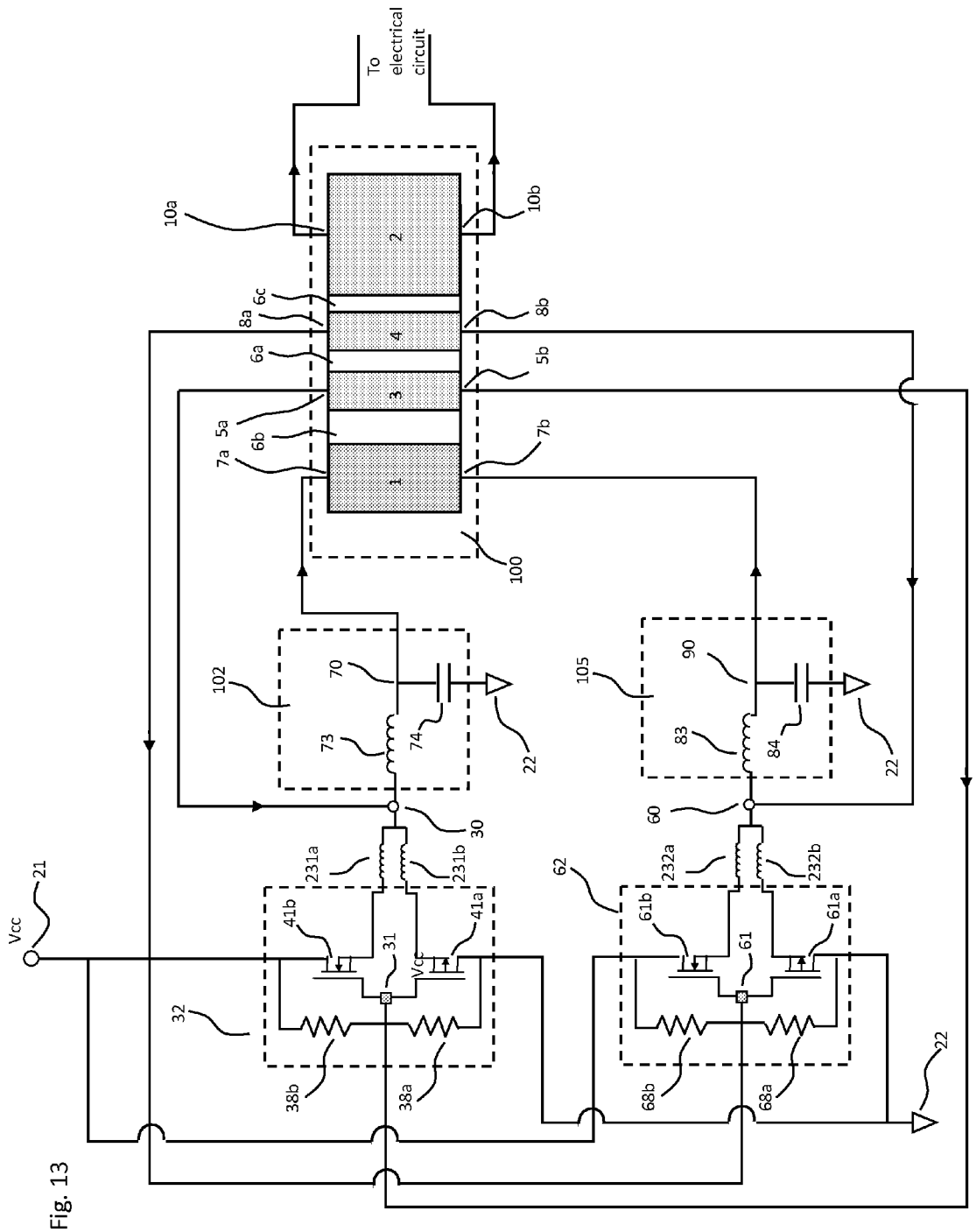

FIG. 13 depicts an embodiment of exemplary subclass of full-bridge autonomic intrinsic piezoelectric transformer DC/AC voltage level shift circuit in accordance with the present invention.

Figure 14:
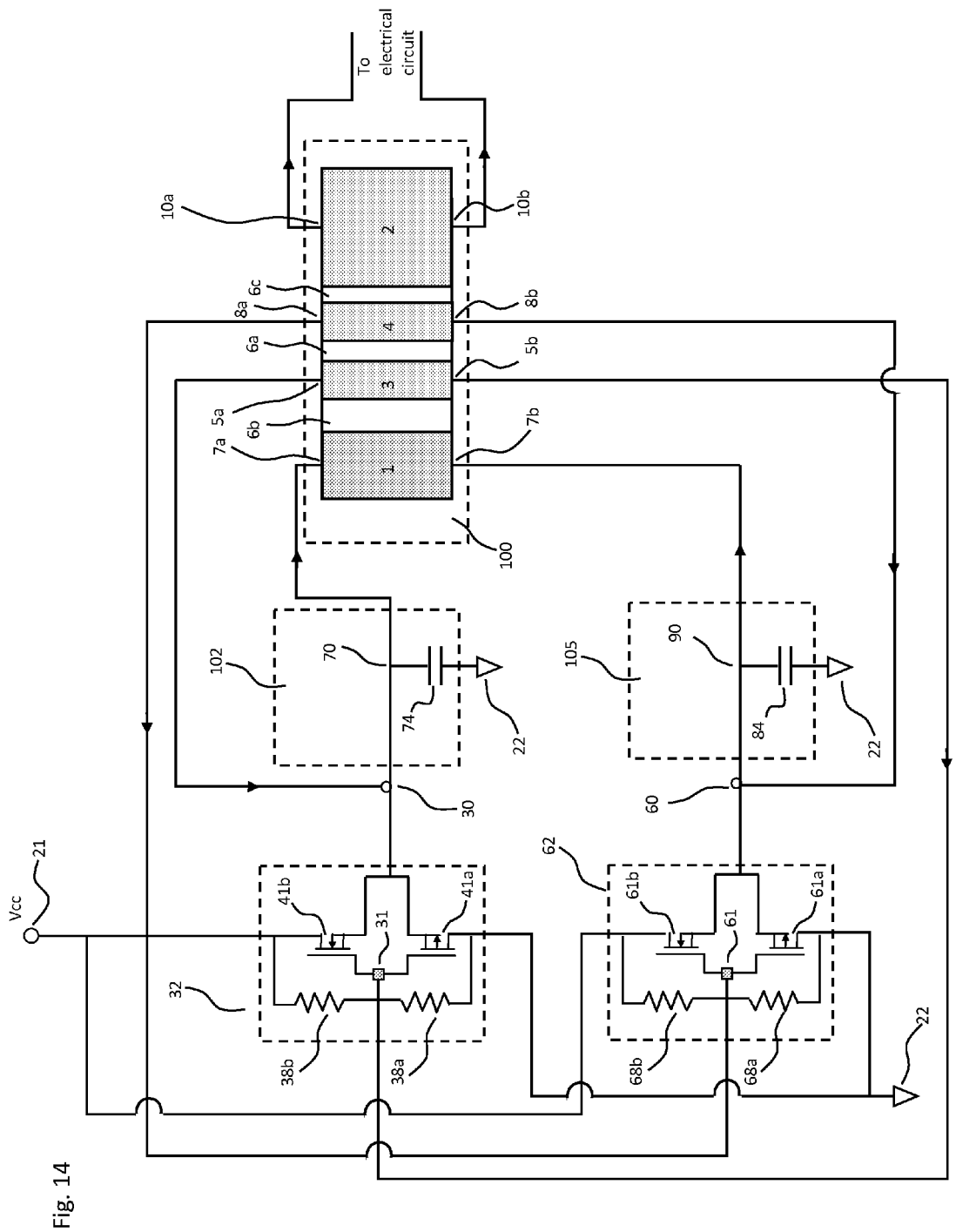

FIG. 14 shows an embodiment of exemplary subclass of full-bridge autonomic intrinsic piezoelectric transformer DC/AC voltage level shifter circuit in accordance with the present invention.

V. DESCRIPTION OF THE EMBODIMENTS OF THE INVENTION

Figure 1:
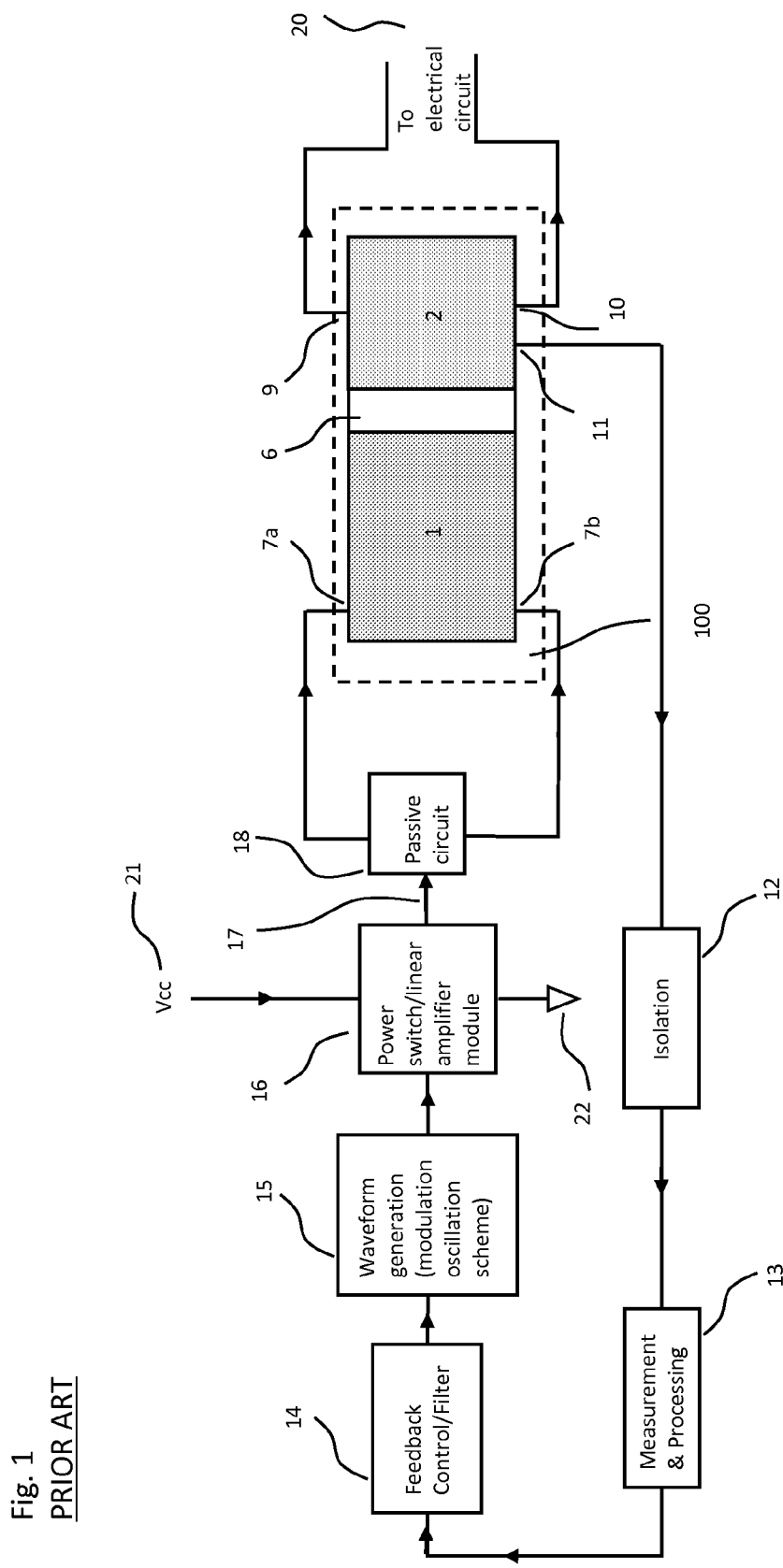
Figure 2:
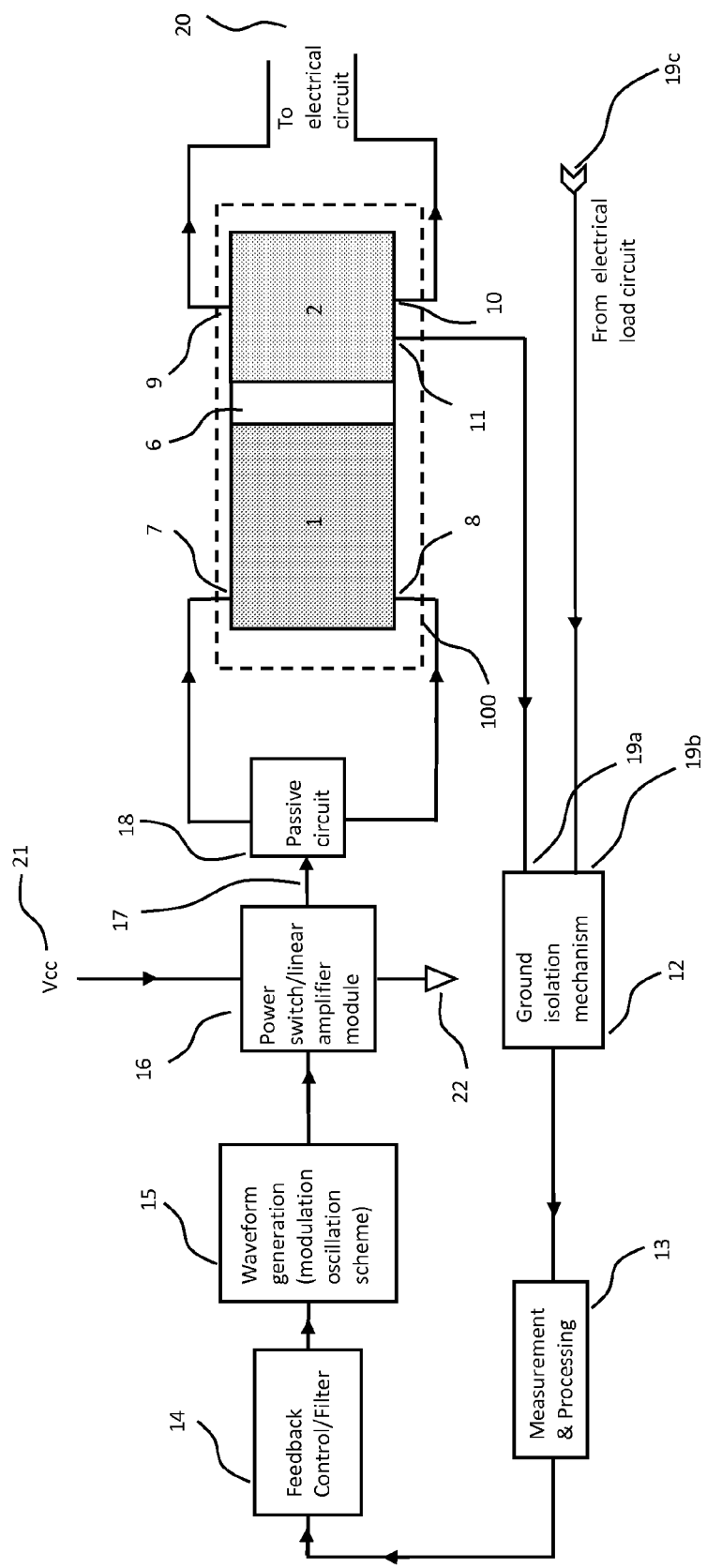
Figure 3:
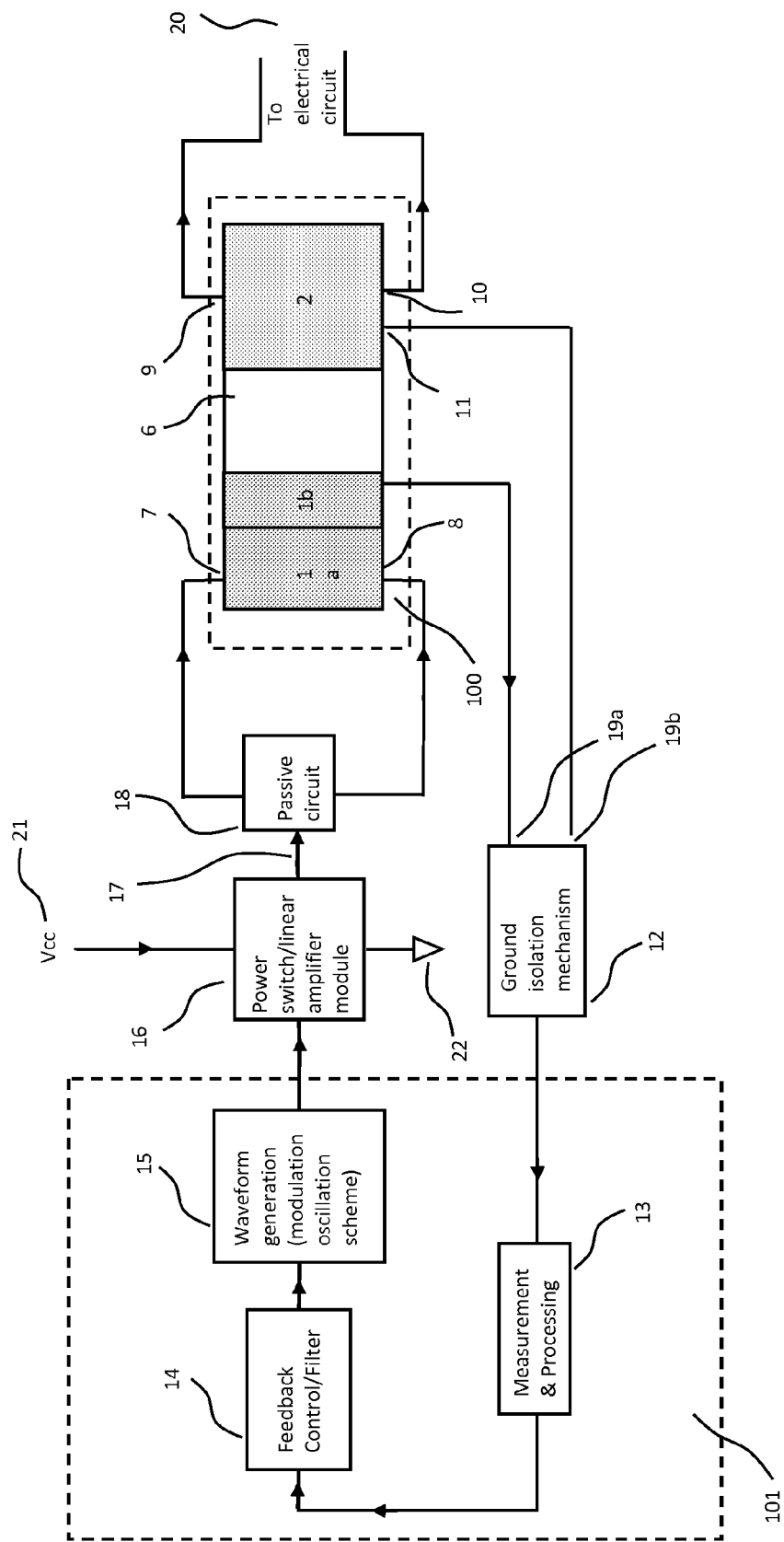
FIG. 3 illustrates an of extrinsic self-adjustable drive frequency waveform circuit using feedback control of measurements taken at the primary (input) side and the secondary (output) side of a piezoelectric transformer.
Figure 4:
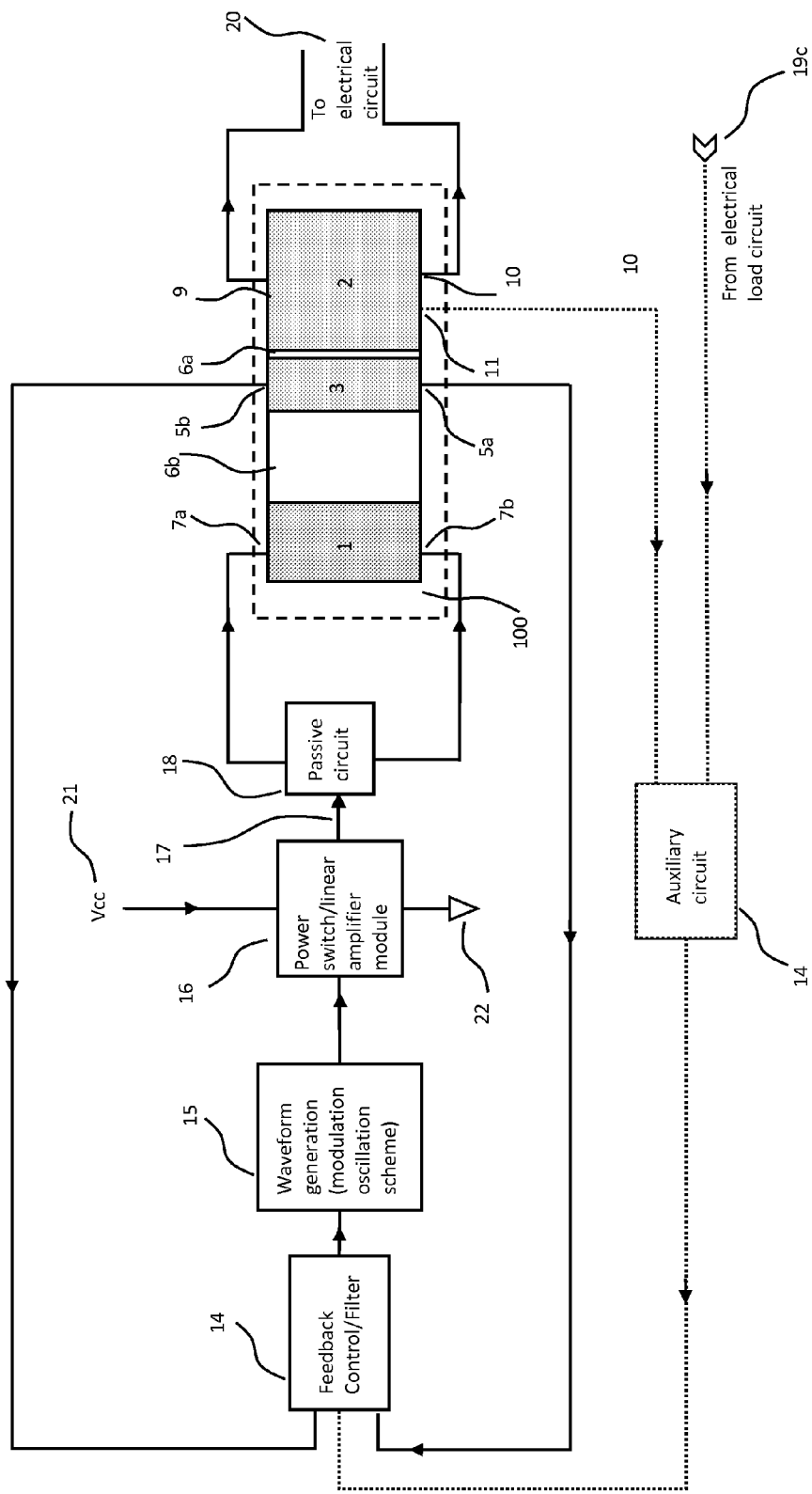
FIG. 4 shows a prior art extrinsic self-adjustable drive frequency waveform circuit employing an electrically isolated tertiary subcomponent of the secondary for voltage regulation.
Figure 5:
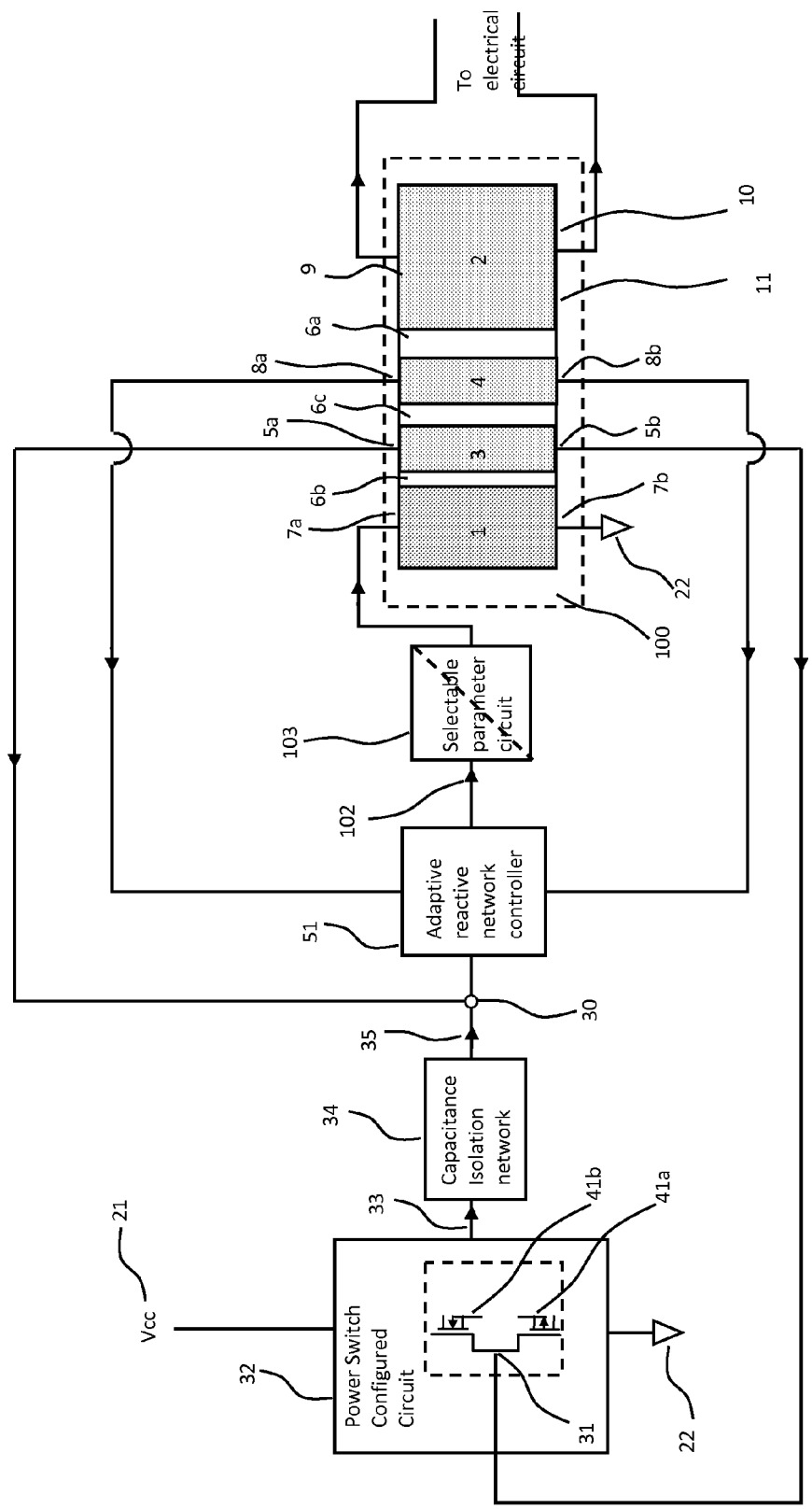
FIG. 5 depicts an embodiment of an intrinsic adaptive self-adjustable piezoelectric transformer circuit in accordance with the present invention.

In accordance with an embodiment of the present invention, referring to FIG. 5, the circuit of this embodiment includes electrically isolated tertiary sections 3 and 4 of piezoelectric transformer device 100 that are both isolated both from the primary components 1 and secondary components (output) 2. A set of electrodes are disposed, preferably integrally, to tertiary section 3 and similarly to tertiary section 4 as to generate a charge when mechanically excited. A floating (+ve) electrical tap 5*b* of the tertiary section 3 is directly attached to a gate drive input 31 of semiconductor switch components 41*a*, 41*b* of power switch subcircuit 32. Power switch subcircuit 32 has a rail supply dc voltage 21 of amplitude Vcc and a ground connection 22 that is now completely isolated from the primary section 1 and secondary section 2 of the piezoelectric transformer device 100. A square wave pulse train output 33 of power switch subcircuit 32 acts as input to an isolation capacitance subcircuit 34. The capacitance isolation subcircuit insulates from capacitance coupling between semiconductor switch components 41 forming the switching power topology of power switch subcircuit 32. The output 35 of isolation capacitance subcircuit 34 acts as a control input to an adaptive reactive network subcircuit 51. The floating (+ve) electrical tap 5*a* of the tertiary section 3, the, possibly separate, floating (+ve) and floating (−ve) electrode taps 8*a* and 8*b* respectively of the isolated tertiary section 4 of piezoelectric transformer 100 are control inputs to an adaptive reactive network subcircuit 51. In some embodiments, tap 5*a* is directly loop connected to controller node 30 with no intervening circuitry components. Similarly, tap 5*b* is directly loop connected to gate drive node 31 with no intervening circuitry components. The adaptive reactive network controller 51 processes the electrical values (currents/voltages) provided by inputs from taps 8*a* and 8*b* and controller node 30 as to execute an internal analog, digital or hybrid analog/digital signal and generate a command signal 102 that sets the passive parametric values of the selectable parameter circuit 103. Based upon the input the adaptive reactive network controller 51 may adjust the equivalent inductance value, the equivalent capacitance value or both of the selectable parameter circuit 103. The voltage waveform is electrically connected to a set of electrodes 7a disposed integral to the primary (input) side 1 of the piezoelectric transformer device 100 as to induce fluctuations in electrical field at the same adjusted waveform frequency as the pulse train 33 due to a common ground electrode 22 of a matching set of opposite internal electrodes 7b that these share with ground 22 of the power switch subcircuit 32. The electrodes of primary component 1 of the piezoelectric transformer 100 are so configured as to utilize the converse effect of piezoelectric material. The converse effect causes an internal stress cycle at a waveform frequency common to that of the pulse train 33. The induced stress cycle of section 1 couples mechanically with a tertiary output section 3 of device 100 via electrical isolation regions 6a and 6b. Regions 6a and 6b are constructed as to cause region 3 to be electrically isolated from the primary (input) component 1 and the secondary (output) component 2 of the piezoelectric transformer 100. Region 3 incorporates sets of electrodes that use the converse effect of the induced stress cycle as to generate voltages at locations 5a and 5b. The potential difference between the 5a and 5b and the potential between locations 8a and 8b represents a sinusoidal voltage waveform, or sinusoidal current that is not referenced to the ground reference of either the primary component 1 or the secondary component 2 or to each other. Both potential difference sinusoidal voltages represent a small phase shift of the actual operating mechanical frequency of the device 100. This is advantageous in that the circuit of FIG. 5 both now adjusts the drive waveform seen at 7a and 7b and simultaneously adjusts the selectable parameter circuit 103, e.g., an LC tank circuit, as to reflect any variations on electrical loading conditions at the output 10a and 10b of the secondary component 2 of the piezoelectric transformer 100, along with any variations in supply condition Vcc.

In keeping with the invention, selectable parameter circuit 103 may be an LC circuit that implements a soft start condition, or it may be an LC circuit that implements a form of voltage switching condition such as Zero Voltage Switching (ZVS) or Zero Current Switching (ZCS). There is no restriction implied as to the selection of the topology of the selectable parameter circuit 103.

Figure 6:
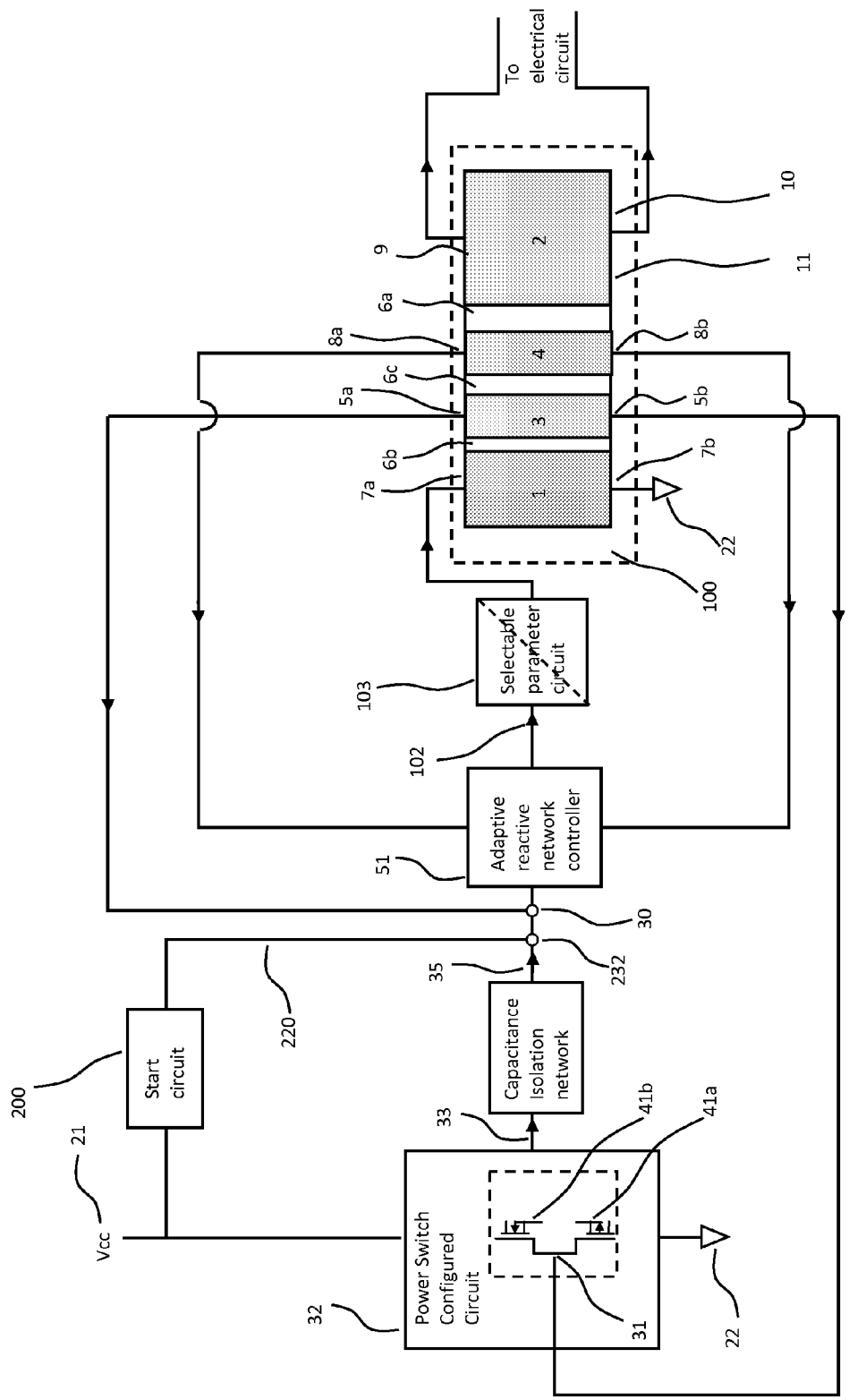
FIG. 6 illustrates a block diagram of an intrinsic self-adjusting piezoelectric transformer circuit that incorporates an internal start circuit in accordance with the present invention.

Referring to FIG. 6, a start-up circuit 200 is connected to the bus dc voltage 21 with having amplitude Vcc. Upon execution of a "turn-on" condition that may be generated either externally or generated internally within the adaptive reactive network controller 51, the voltage Vcc will flow into the start circuit 200. Internal "state change" component or components are disposed internal to start circuit 200. The inflow of dc voltage Vcc will cause the state change components to adopt a "normally on" condition as to allow an outflow of voltage along electrical conduit 220. Electrical conduit 220 is electrically connected to the adaptive reactive network controller 51. As voltage Vcc continues to flow into the start circuit 200 it causes internal component or components to adopt a "normally off" condition as to prevent further voltage from flowing through conduit 220.

The applied voltage is transmitted through the selectable parameter circuit 103 and hence into the (+ve) electrode terminals of primary component 1 of the piezoelectric transformer 100. This will cause a mechanical excitation of primary component 1 that, due to mechanical coupling, will produce a voltage at (−ve and +ve) tap 5a and 5b of the isolated tertiary component 3 of the piezoelectric transformer due to its common electrical connection to the gates of the semiconductor components of the power switch subcircuit 32. The passive components of the start circuit of 200 are selected as to enable the duration of the initial pulse of the start circuit to provide sufficient voltage at the common gate 31 as to cause all said semiconductor switches to attain an "on" condition. Due to the "on" state of the said semiconductor components, voltage Vcc can now flow from dc source 21 as to provide a pulse train waveform of increasing voltage amplitude that will continue to increase until it reaches approximate amplitude Vcc. The circuit of FIG. 6 now proceeds to operate exactly as described in FIG. 5.

Figure 7:
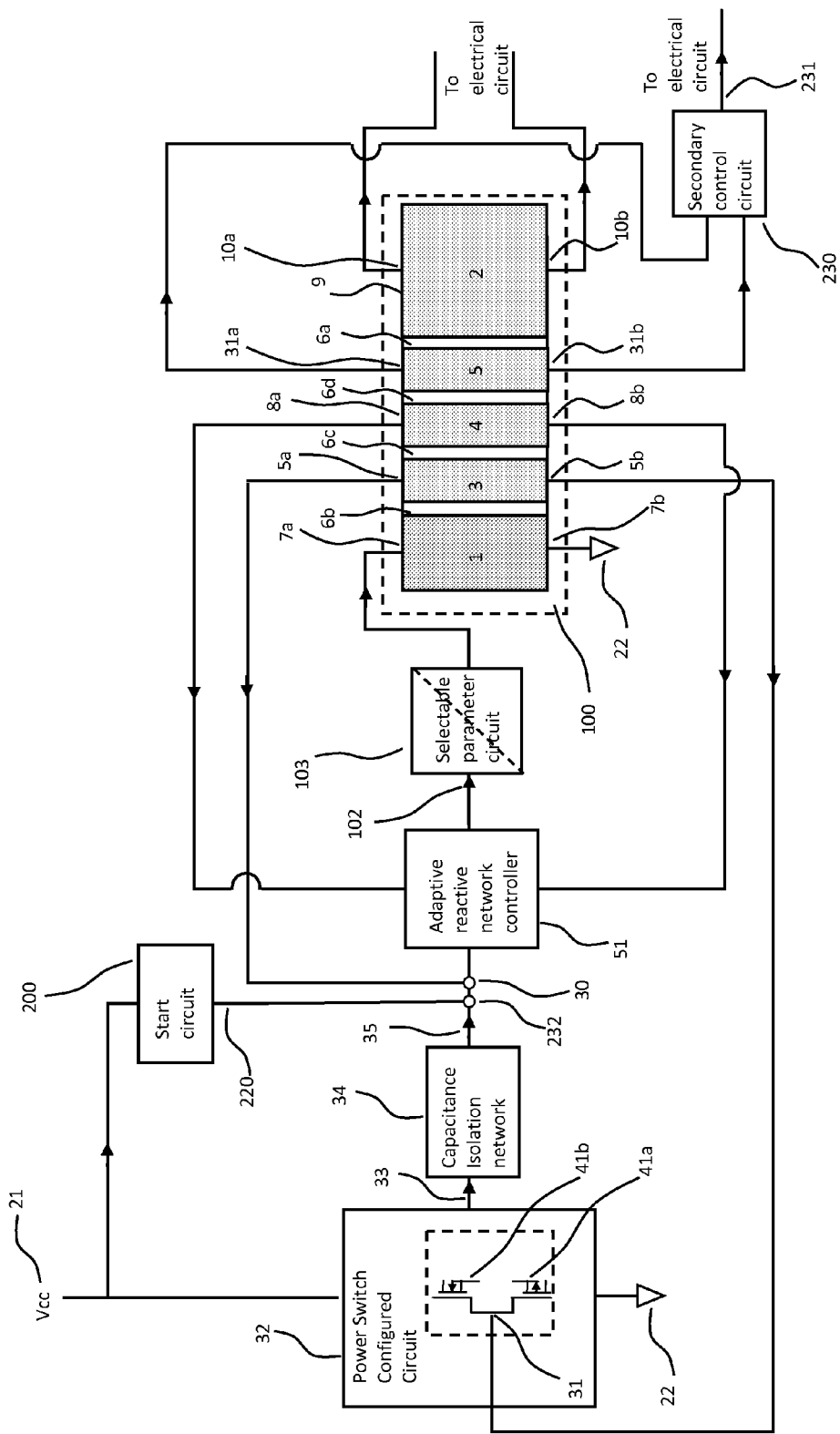
FIG. 7 depicts an intrinsic adapiezoelectric transformerive self-adjustable piezoelectric transformer incorporating an internal start circuit and secondary control circuit in accordance with the present invention.

Referring to FIG. 7, its operation proceeds similar to FIG. 6 with an additional electrically isolated tertiary component 5 of the piezoelectric transformer 100 that is isolated from the other components 1,2,3,4. A set of one or more electrodes (+ve) and a set of one or more electrodes (+ve) are disposed in section 5 as to enable the mechanical cyclic stress of primary component 1 of the piezoelectric transformer 100 to induce a potential difference between the set of (+ve) electrodes connected at output tap 31a and set of (+ve) electrodes connected at output tap 31b that is a sinusoidal voltage waveform of the same frequency as that of the cyclic stress at primary component 1 with of floating ground distinct from the ground 22 of the primary component 1 of piezoelectric transformer 100. Said outputs 31a and 31b are electrically connected as inputs to a secondary control circuit 230 which performs calculus on these inputs and produces an output 231 that is connected to one or more components or subcircuits of the output side electrical circuitry as to induce a timing or parametric control operation.

Figure 8:
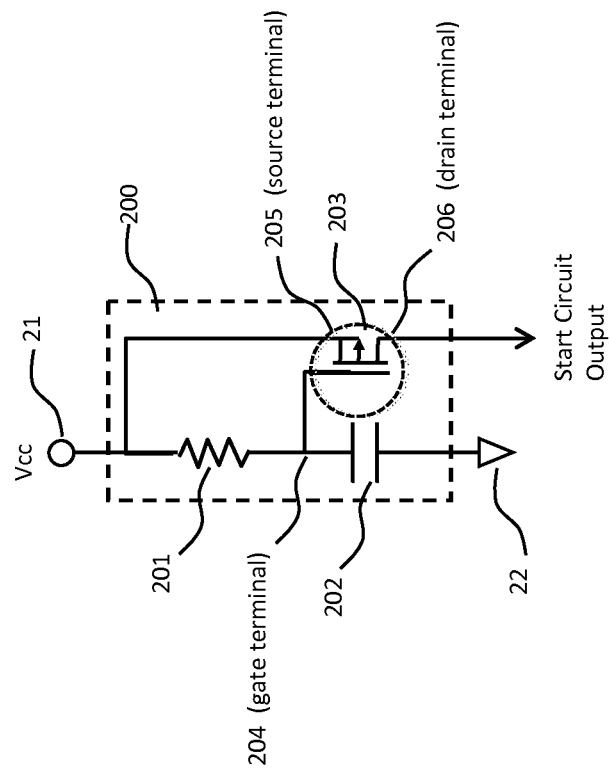
FIG. 8 shows an embodiment of the internal start circuit in accordance with the present invention.

In accordance with an aspect of the invention, FIG. 8 illustrates an exemplary start circuit 200. A p-channel MOSFET 203 has its source terminal 205 connected to the primary dc voltage supply 21 of amplitude Vcc. The drain terminal of the P-channel MOSFET 203 is connected to the adaptive reactive controller 51. The gate terminal is so disposed as to be electrically connected at junction 204 that is located between a resistor 201 and a capacitor 202. The other terminal of the capacitor 202 is connected to common ground 22. Upon internal or external command the voltage Vcc becomes available and charge proceeds to flow at junction 21. Initially the potential difference between gate terminal 204 and source terminal 205 is less negative than the threshold value (a negative voltage for p-channel) of the MOSFET 203, enabling source-drain charge to flow from 205 to 206 and hence to the adaptive reactive controller 51. Charge from terminal 21 similarly flows into the capacitor 202 via resistor 201. The charge capacitor 202 will steadily increase in value until such time as the charge can no longer flow through the resistor 201. At this time potential difference between gate terminal 204 and source terminal 205 is more negative than the threshold value of the device, the channel disappears, and only a very small subthreshold current can now flow between the source and the drain.

Many other similar circuits can be employed in the capacity of a start circuit 200. It is advantageous that start circuit 200 consists of discrete, non-digital and nonmagnetic components. However, in some embodiments, start circuit 200 may include digital and magnetic components. In addition, in some embodiments, start circuit 200 can be connected to other parts of the primary side circuit. For example, the drain terminal 206 can connect instead to the common gate terminal 31 of power switch device 32. In this case, start circuit 200 would employ an N-channel MOSFET replacing the P-channel MOSFET 203.

Figure 9:
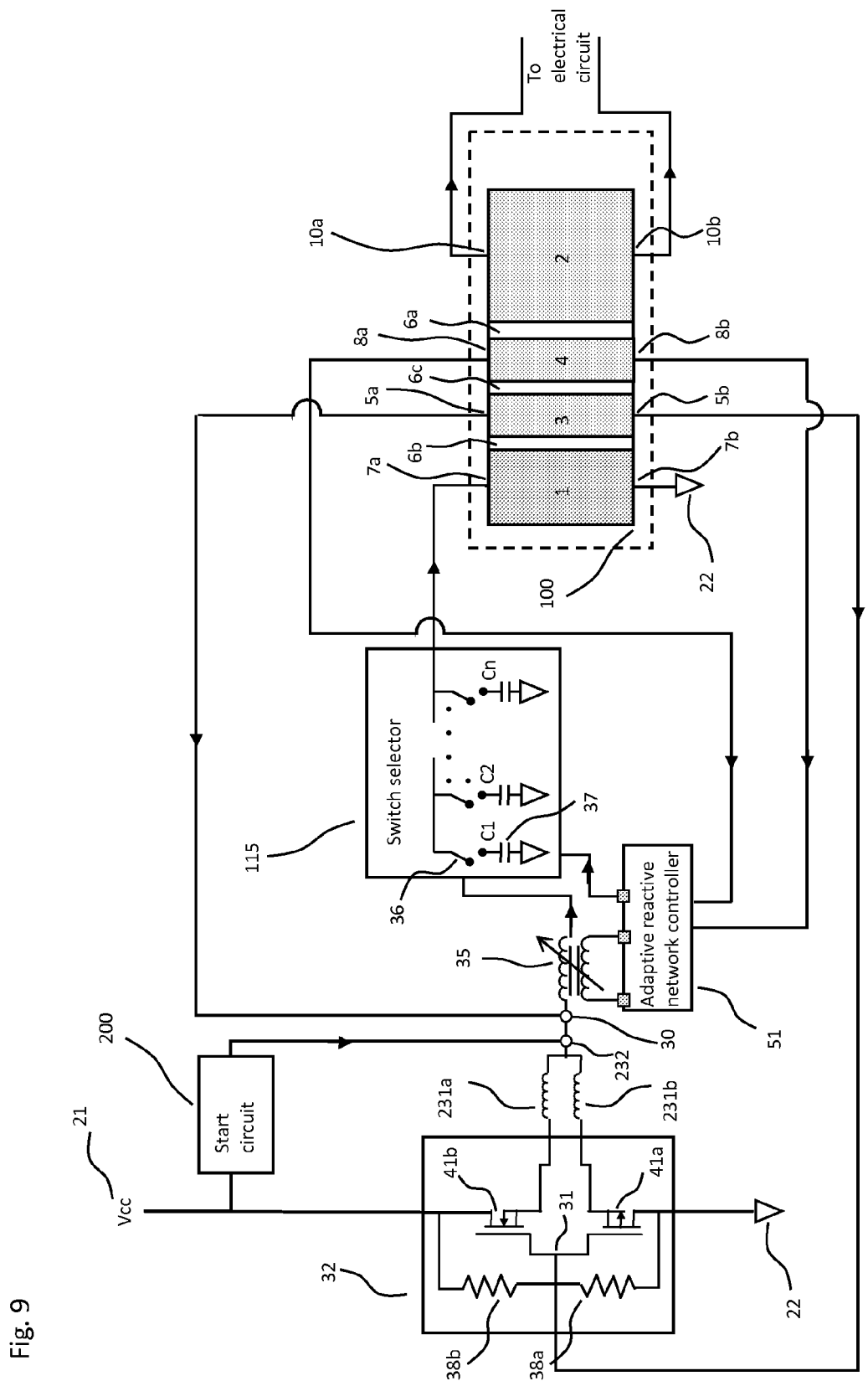
FIG. 9 illustrates an exemplary class of half-bridge embodiment of adaptive intrinsic piezoelectric transformer DC/AC voltage level shifters circuit in accordance with the present invention.

Referring to FIG. 9, the operation of the piezoelectric transformer 100 will be initiated by the start circuit 200 as previously described. Once initiated as to receive a voltage signal at common gate input terminal 31, the sinusoidal voltage gate signal drives power switch device 32. In keeping with the invention, power switch device 32 comprises a half-bridge switch topology comprising a pair of complementary transistor devices. In the illustrated embodiment, switch 41a is a p-channel MOSFET and switch 41b is a complementary n-channel MOSFET. When switch 41a is open pull down resistor 38a will cause the gate drive voltage at terminal 31 to be pulled to common ground value 22. The resistor 38a is of high value (>10 MΩ). When switch 41b is open pull up resistor 38b will cause the gate drive voltage at terminal 31 to be pulled to dc voltage level Vcc at terminal 21. The resistor 38b is of high value (>10 MΩ). The drain terminal of switch 41a and the drain terminal of switch 41b are both connected to very small value isolation inductors 231a and 231b, respectively. The advantage of these very small value isolation inductors (<10 µH) in the circuit is to provide capacitance isolation between the switch components as to enable the power switch device 32 to operate at higher safe circulating currents than is achievable by any standard bridge topology. The common output of the half-bridge pre-circuit is to provide a voltage pulse train of the same frequency as seen at terminal 31 and of amplitude approximately that of Vcc. The common (+ve) electrodes and the common (−ve) electrodes of isolated tertiary component 4 of the piezoelectric transformer device 100 are connected as inputs to an adaptive reactive network controller 51 that, in this embodiment, comprises a logic engine whose outputs are based upon the (sinusoidal) electrical parameters thus provided by these control parameters taken on the secondary side of the piezoelectric transformer device. A second internal control parameter is provisioned by common (+ve) electrodes of a second isolated tertiary component 3 of the piezoelectric transformer 100. These control inputs adjust the values of variable internal inductor 35 and variable internal reactance circuit 115. The pair 35 and 115 form an internal Q-enhanced parallel band pass LC tank where both the equivalent inductance $L_{equ}$ and the equivalent capacitance $C_{equ}$ of the variable internal inductor 35 and internal reactive circuit 115, respectively, are adjustable parameters. The control inputs from 8a and 8b selectively determine which subset of switches 36 of variable internal reactive circuit 115 are in a closed state and which are in an open state as to enable parallel coupling of a selected corresponding subset of capacitance values to provide an equivalent value $C_{equ}$ of the variable internal reactance circuit.

Figure 10:
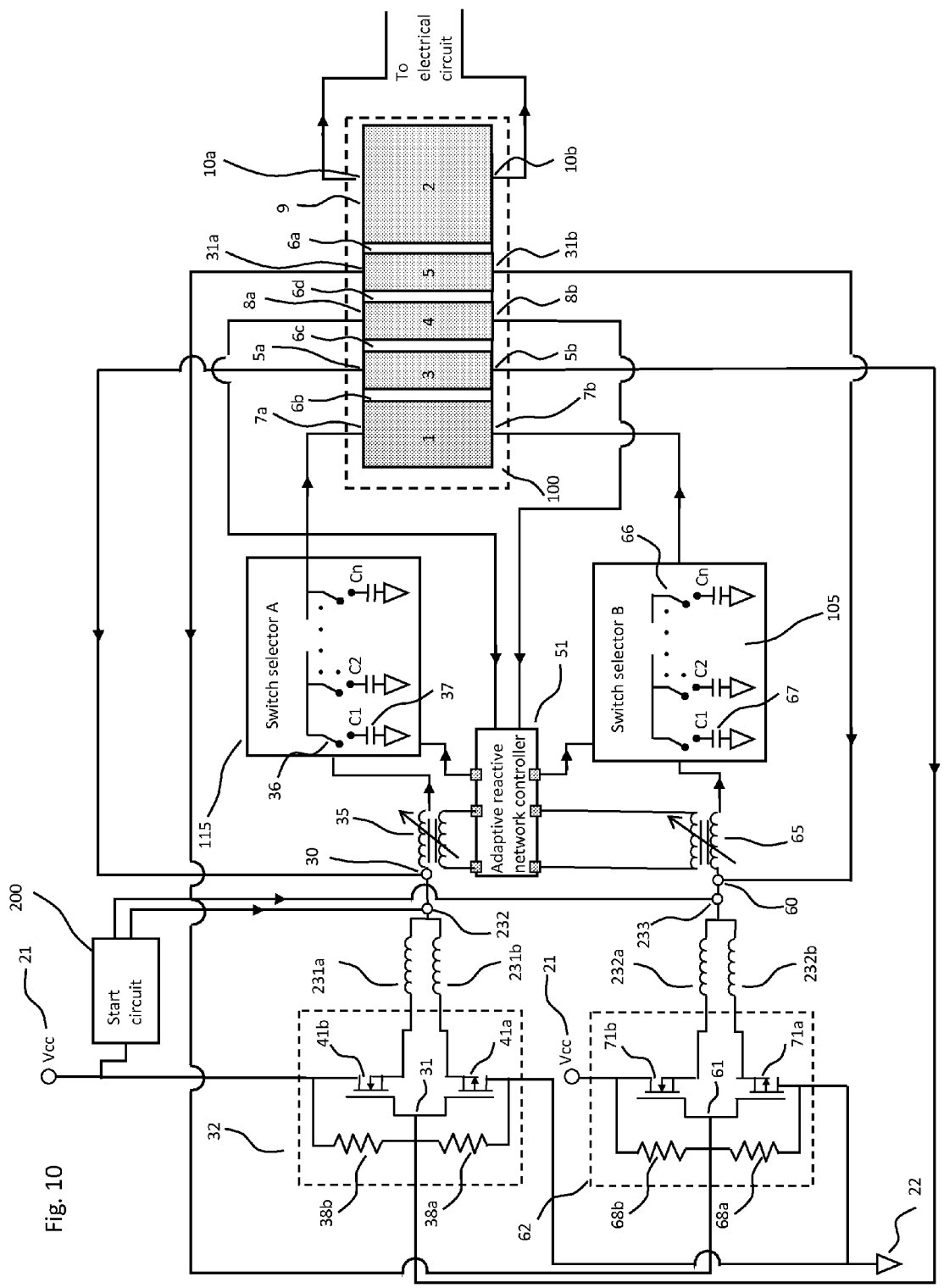
FIG. 10 shows an exemplary class of full-bridge embodiment of adaptive intrinsic piezoelectric transformer DC/AC voltage level shifters in accordance with the present invention.

Referring to FIG. 10, the operation of the piezoelectric transformer 100 will be initiated by the start circuit 200 as previously described. In the full bridge embodiment case the start circuit 200 has a connection to the circuit at 232. The start circuit allows current pulse to initiate piezoelectric transformer 100. Once initiated piezoelectric transformer 100 will deliver out of phase voltage signals to 31 and 61, while referenced at points 232 and 233, respectively. The resistors 38a and 38b as well as 68a and 68b, provide a voltage reference for the gate signals of each half-bridge complimentary MOSFET pair. This allows proper biasing of MOSFETs 41a and 41b and 71a and 71b for effective switching via tertiary components 3 and 5 of piezoelectric transformer 100. The voltage signals delivered by piezoelectric transformer 100 now begin the active driving of the MOSFETs 41a and 41b and 71a and 71b from tertiary components 3 and 5 of piezoelectric transformer 100. By driving the MOSFET pairs a corresponding voltage pulse train at the frequency of terminal 31 and 61 at amplitude equal to that of Vcc is delivered through the respective isolation inductor 231a/231b or 232a/232b. The common (+ve) electrodes and the common (−ve) electrodes of isolated tertiary component 4 of the piezoelectric transformer 100 are connected as inputs to an adaptive reactive network controller 51 that, in this embodiment, comprises a logic engine whose outputs are based upon the (sinusoidal) electrical parameters thus provided by these control parameters taken on the secondary side of the piezoelectric transformer 100. The pair 35 and 102, and 65 and 105 form an internal Q-enhanced parallel band pass LC tank for each bridge where both the equivalent inductance $L_{equ}$ and the equivalent capacitance $C_{equ}$ of the internal reactive circuit (115/35 and 105,65) are adjustable parameters. The control inputs from 8a and 8b with conditioning in adaptive reactive network controller 51 selectively determine which subset of switches 36 and 66 that are in closed state and which are in an open state as to enable parallel coupling of a selected corresponding subset of capacitance values to provide an equivalent value $C_{equ}$ of the internal tank circuit. The same control inputs 8a and 8b can also, through computation in adaptive reactive network controller 51, actively control the inductance values of 35 and 65. In the embodiment depicted in FIG. 10, tertiary components 3 and 5 are separately isolated to allow their respective loop connections to gate drive node 31 together with control node 30 and to gate drive node 61 together with control node 60, respectively without intervening circuit components.

The embodiment illustrated in FIG. 10 includes a set of complimentary half-bridge MOSFETs. Each bridge operates at opposite phase from the other allowing current to pass from Vcc (21) through piezoelectric transformer 100 in an alternating fashion. The major benefit to this embodiment is the fact that the potential experienced by piezoelectric transformer 100 is significantly increased, e.g., effectively doubled, increasing the power throughput at a set Vcc level.

Other embodiments for the intrinsic adaptive network controller 51 block may be enabled by other combinations of voltage or current inputs from any subset of tap electrodes of piezoelectric transformer 100 as to include primary (driven), secondary (output) and any isolated tertiary components.

Referring to FIG. 11a, the operation of the piezoelectric transformer 100 will be initiated by the start circuit. The start circuit, such as present in the embodiment of FIG. 10 is assumed, and therefore, not shown. The following description is addressed to steady state operation. With reference to tap 30, the voltage potential at tap 31 is a sinusoidal signal. Voltage potential at tap 31 is selected to be identical voltage potential at tap 5b. Because the voltage potential at tap 31 is selected as identical with the voltage potential at tap 5b, this provides a potential voltage waveform at tap 31 that is at the same frequency as the mechanical stress frequency induced in tertiary component 3 but of exactly opposite phase. However, it is the applied potential voltage across primary (input) side 1 that causes this mechanical frequency waveform. This is represented by the potential difference between tap 7a connected to the output side of the reactive network, e.g., LC circuit, and tap 7b connected to ground. Note that this requires that tertiary component 3 be electrically isolated from primary component 1 of piezoelectric transformer 100. If tertiary component 3 were non-isolated the electrical connection to either point 31 or point 71 from tertiary component 3 piezoelectric transformer 100 would now create a short circuit condition since Primary component 1 of piezoelectric transformer 100 is ground referenced.

When the potential differential between tap 31 and tap 30 exceeds the (+ve) gate turn on voltage level (e.g. +1.2V) it will initiate a pulse to occur that will cease when the potential differential between tap 31 and tap 30 drops below the (+ve) gate turn on voltage level. Similarly, when the potential differential between tap 31 and tap 30 drops below the (−ve) gate turn on voltage level (e.g. −1.2V) it will initiate a pulse to occur that will cease when the potential differential between tap 31 and tap 30 rises above the (+ve) gate turn on voltage level. This alternating sequence generates a pulse train to occur between terminal 30 and ground 22 that is approximately the amplitude Vcc at 21. This pulse train must now be similarly in opposite phase to the waveform to the potential difference between tap 7a and tap 7b (=common ground 22). Because the voltage potential waveform is in opposite phase to the potential difference between tap, which is in turn in opposite phase to the potential between tap 30 and ground, the pulse train waveform is now exactly in phase with the previous potential difference waveform taken across tap 30 and common ground 22. The circuit now acts to follow the frequency generated as the potential difference between taps 5a and 5b, but that is in phase with the potential taken at tap 30 with reference to common ground.

Suppose that there is now some operational change as to cause a fluctuation in the operating mechanical frequency of piezoelectric transformer 100. For instance, let us suppose that there is a change in the load condition at the electrical output taps 10a and 10b as to shift the mechanical resonance. The change in load will now cause a change in the behavior of piezoelectric transformer 100. This is best seen by considering any of the conventional single branch model representations of piezoelectric transformer 100 as an electrical circuit as illustrated in FIG. 11b. The input and output dielectric capacitances 401 and 402 remain constant, but as a variation in load 406, or other variational parameter, occurs it will require a new model that now resets the internal mechanical values 403, 404, and 405. These new values will correspond to the new mechanical resonance value of the piezoelectric transformer 100. These values now inserted into FIG. 11a will now act as to cause a frequency shift between the potential differential (−ve) of 5a and (+ve) 5b. This waveform at the adjusted frequency acts as potential input at gate terminal input 31 with reference to tap 30 as to cause the pulse train output as seen at 30 with reference to 31 to be similarly adjusted in waveform frequency. The frequency adjusted pulse train at 30 acts as input to the reactive (LC) circuit 102 whose output voltage signal at tap 7a with reference to common ground 22 is a sinusoid waveform. The frequency of that sinusoidal waveform is as to now follow the adjustment seen in the potential difference between tap 30 and tap 31 but in exactly the opposite phase, which is now exactly in phase with the adjusted frequency waveform represented by the potential difference between tap 5b and tap 5a.

Referring to FIG. 12, the operation mimics that of FIG. 11a where the high side power outputs of the power bridge embodiment of FIG. 11a is now instead directly coupled to the electrodes 7a and 7b of the drive side of input primary component 1 of piezoelectric transformer 100.

Referring to FIG. 13, the operation of the piezoelectric transformer 100 will be initiated by the start circuit 200 as previously described. In the full bridge embodiment of FIG. 13, the start circuit 200 has a connection to the circuit at 30. The start circuit 200 allows current pulse to initiate piezoelectric transformer 100. Once initiated piezoelectric transformer 100 will deliver out of phase voltage signals to 31 and 61, while referenced at points 30 and 60, respectively. The resistors 38a and 38b as well as 68a and 68b, provide a voltage reference for the gate signals of each half-bride complimentary MOSFET pair. The allows proper biasing of MOSFETs 41a and 41b, and 61a and 61b for effective switching via tertiary components 3 and 5 of piezoelectric transformer 100. The voltage signals delivered by piezoelectric transformer 100 now begin the active driving of the MOSFETs 41a and 41b, and 71a and 71b from tertiary components 3 and 5 of piezoelectric transformer 100. By driving the MOSFETs pairs, a corresponding voltage pulse train at the frequency of terminal 31 and 61 at amplitude equal to that of Vcc is delivered through the respective isolation inductor 231a/231b or 232a/232b. The reactive circuit 102 and 105 creates a resonant drive condition for primary component 1 (input) of piezoelectric transformer 100. The inductive (73 and 83) and capacitive (70 and 90) components of 102 and 105 are sized for the specific load condition and frequency for the application.

Referring to FIG. 14, the operation mimics that of FIG. 13 where now the high side power outputs of the full bridge embodiment of FIG. 13 are directly coupled to the electrodes 7a and 7b of the drive side of the input primary component 1 of piezoelectric transformer 100. This embodiment consists of a set of complimentary half-bridge MOSFETs. Each bridge operates at opposite phase from the other allowing current to pass from Vcc (21) through piezoelectric transformer 100 in an alternating fashion. An advantage of this embodiment is the fact that the potential experienced by piezoelectric transformer 100 is significantly increased, e.g., effectively doubled, increasing the power throughput at a constant Vcc level as compared to the half-bridge embodiment.

The embodiments shown in FIG. 11 to FIG. 14 may further incorporate one or more additional tertiary taps, as shown in FIG. 9 and FIG. 10 as to provide additional functions such as output current or voltage regulation.

It should be noted that the present invention may, however, be embodied in many different forms and should not be construed as limited to the embodiments and prototype examples set forth herein; rather, the embodiments set forth herein are provided so that the disclosure will be thorough and complete, and will fully convey the scope of the invention to those skilled in the art. The accompanying drawings illustrate embodiment and prototype examples of the invention.

It should be noted that the present invention may, however, be embodied in many different forms and should not be construed as limited to the embodiments and prototype examples set forth herein; rather, the embodiments set forth herein are provided so that the disclosure will be thorough and complete, and will fully convey the scope of the invention to those skilled in the art. The accompanying drawings illustrate embodiment and prototype examples of the invention.

As used above "substantially," "generally," and other words of degree are relative modifiers intended to indicate permissible variation from the characteristic so modified. It is not intended to be limited to the absolute value or characteristic which it modifies but rather possessing more of the physical or functional characteristic than its opposite, and preferably, approaching or approximating such a physical or functional characteristic. "Substantially" also is used to reflect the existence of manufacturing tolerances that exist for manufacturing components.

Based on this disclosure, one of ordinary skill in the art will appreciate that the use of "same", "identical" and other similar words are inclusive of differences that would arise during manufacturing to reflect typical tolerances for goods of this type.

Those skilled in the art will appreciate that various adaptations and modifications of the exemplary and alternative embodiments described above can be configured without departing from the scope and spirit of the invention. Therefore, it is to be understood that, within the scope of the appended claims, the invention may be practiced other than as specifically described herein.

We claim:

1. A piezoelectric transformer circuit comprising:
   a piezoelectric transformer including a primary side component having first and second electrodes, a secondary side component having first and second electrodes, and at least one tertiary component having first and second electrodes;
   a power bridge including one or more switches, each switch having a gate terminal directly connected to the second electrode of said tertiary component, the first electrode of said tertiary component being connected to a reference for the one or more switches of said power bridge; and
   the first electrode of said primary component being connected to a power bridge output and the second electrode of said primary component being connected to a ground terminal.

2. The piezoelectric transformer of circuit of claim 1 further comprising a reactive network connected in series with said primary side component.

3. The piezoelectric transformer circuit of claim 2 wherein the reactive network includes one or more series inductors and one or more parallel capacitors.

4. The piezoelectric transformer circuit of claim 2 wherein the reactive network includes one or more parallel capacitors.

5. The piezoelectric transformer circuit of claim 1 wherein said power bridge includes first and second semiconductor switches connected in a common source configuration and wherein the tertiary component of said piezoelectric transformer is electrically isolated from the primary and secondary components.

6. The piezoelectric transformer circuit of claim 5 further comprising means for biasing the first and second semiconductor switches.

7. The piezoelectric transformer circuit of claim 5 wherein the first semiconductor switch is a PChannel MOSFET and the second semiconductor switch is an N-Channel MOSFET, said piezoelectric transformer circuit further comprising first and second inductors respectively connected in series with a source terminal the P-Channel MOSFET and the N-Channel MOSFET.

8. A piezoelectric transformer circuit comprising:
   a piezoelectric transformer including a primary side component having first and second electrodes, a secondary side component having first and second electrodes, and a plurality of tertiary components, each tertiary component having first and second electrodes;
   a reactive circuit having an output connected to the first electrode of said primary component;
   an adaptive controller connected a first one of said plurality of tertiary components and to said reactive circuit, the adaptive controller adjusting a reactance of said reactive circuit responsive to input from to the first one of said plurality of tertiary components;
   a power bridge including one or more switches, each switch having a gate terminal directly connected to the second electrode of a second one of said plurality of tertiary components, the first electrode of the second one of the plurality of tertiary components being connected between the means for isolating to a reference for the one or more switches of said power bridge;
   means for isolating capacitance of the one or more switches, said means being connected in series between said power bridge and said adaptive controller; and
   the first electrode of said primary component being connected to a power bridge output and the second electrode of said primary component being connected to a ground terminal.

9. The piezoelectric transformer circuit of claim 8 further comprising a start circuit connected to an output of said means for isolating, the start circuit applying an impulse to initially excite said piezo electric transformer.

* * * * *